United States Patent
Sun et al.

[11] Patent Number: 6,166,906
[45] Date of Patent: Dec. 26, 2000

[54] HEAT-DISSIPATING MODULE FOR AN ELECTRONIC DEVICE

[75] Inventors: Ming-Shen Sun; Shao-Pai Lu, both of Taipei, Taiwan

[73] Assignee: Compal Electronics, Inc, Taipei, Taiwan

[21] Appl. No.: 09/494,034

[22] Filed: Jan. 31, 2000

[51] Int. Cl.[7] .................................................. H05K 7/20
[52] U.S. Cl. .................. 361/697; 361/695; 361/703; 361/704; 361/717; 361/718; 174/16.1; 174/16.3; 165/80.3; 165/104.34; 165/104.33
[58] Field of Search .................................. 361/688–695, 361/697–700, 717–720; 257/713–715, 721, 722; 174/15.1, 15.2, 16.1, 16.3; 165/80.2, 80.3, 80.4, 104.33, 104.34, 185

[56] References Cited

U.S. PATENT DOCUMENTS

| | | | |
|---|---|---|---|
| 5,598,320 | 1/1997 | Toedtman et al. | 361/687 |
| 5,764,482 | 6/1998 | Meyer, IV et al. | 361/699 |
| 5,781,409 | 7/1998 | Mercedy, III | 361/687 |
| 5,841,633 | 11/1998 | Huang | 361/695 |
| 5,875,095 | 2/1999 | Webb | 361/700 |
| 5,940,269 | 8/1999 | Ko et al. | 361/697 |
| 5,960,865 | 10/1999 | Costa et al. | 165/86 |
| 5,963,424 | 10/1999 | Hileman et al. | 361/695 |
| 6,047,765 | 4/2000 | Zhan | 165/80.3 |

*Primary Examiner*—Leo P. Picard
*Assistant Examiner*—Boris L. Chervinsky
*Attorney, Agent, or Firm*—Pillsbury Madison & Sutro LLP

[57] ABSTRACT

A heat-dissipating module for dissipating heat generated by an electronic component includes a fan base formed with a fan mounting cavity, a heat-dissipating fan mounted in the fan mounting cavity, a heat-conducting plate adapted to contact a heat-dissipating side of the electronic component, and a connecting shaft having a mounting section that is mounted on the heat-conducting plate and a pivot section that extends from the mounting section and that is mounted pivotally on the fan base, thereby permitting movement of the heat-conducting plate toward and away from the heat-dissipating side of the electronic component.

13 Claims, 4 Drawing Sheets

HEAT-DISSIPATING MODULE FOR AN ELECTRONIC DEVICE

BACKGROUND OF THE INVENTION

1. Field of the Invention

The present invention relates to a heat-dissipating module for dissipating heat generated by an electronic component in an electronic device, more particularly to a heat-dissipating module which facilitates installation and detachment of the electronic component without the need for detaching the heat-dissipating module and which provides a relatively good heat-dissipating effect.

2. Description of the Related Art

During assembly of a notebook computer, the central processing unit (CPU) is usually installed on a main computer board after most of the components have been installed. Generally, the CPU is designed to be detachable by a local distributor or by a consumer for replacement to suit the consumer's requirement. However, this results in difficulties in the design of a heat-dissipating device for the CPU. A conventional heat-dissipating device generally includes a heat sink, a heat-exchanger pipe, and a heat-dissipating fan. The heat-dissipating device usually has a relatively large size, and is generally disposed adjacent to a side wall of a computer housing to facilitate the discharge of heat from the computer housing. In order to permit detachment and replacement of the CPU, the heat-dissipating device has been designed to include separate parts such that only a part of the heat-dissipating device needs to be detached when installing or removing the CPU.

Referring to FIG. 1, a conventional heat-dissipating device 100 is shown to include two separate parts, one of which includes a heat-exchanger pipe 7 and a heat-sink 9 mounted on the heat-exchanger pipe 7, while the other one of which includes a fan unit 8. The heat-exchanger pipe 7 is in contact with the CPU 6. When the CPU 6 is to be detached for replacement, the heat-exchanger pipe 7 and the heat sink 9 are detached together with the CPU 6. However, since the fan unit 8 is separate from the heat-exchanger pipe 7 and the heat sink 9, the heat-dissipating effect achieved with the use of the heat-dissipating device 100 is relatively poor.

FIG. 2 illustrates another conventional heat-dissipating device 200 which is shown to also include two separate parts, one of which includes a fan unit 8' and a heat sink 9' mounted on the fan unit 8', while the other one of which includes a heat-exchanger pipe 7' that extends to the CPU 6 for contact therewith. In use, only the heat-exchanger pipe 7' needs to be detached when the CPU 6 is installed or removed. However, since the heat-exchanger pipe 7' is not connected to the heat sink 9' and the fan unit 8', the heat-dissipating effect achieved with the use of the heat-dissipating device 200 is still not satisfactory.

SUMMARY OF THE INVENTION

Therefore, the object of the present invention is to provide a heat-dissipating module which facilitates installation and detachment of an electronic component without the need for detaching the heat-dissipating module and which provides a relatively good heat-dissipating effect to prevent overheating of the electronic component.

Accordingly, the heat-dissipating module of the present invention is adapted for dissipating heat generated by an electronic component, and includes a fan base formed with a fan mounting cavity, a heat-dissipating fan mounted in the fan mounting cavity, a heat-conducting plate adapted to contact a heat-dissipating side of the electronic component, and a connecting shaft having a mounting section that is mounted on the heat-conducting plate and a pivot section that extends from the mounting section and that is mounted pivotally on the fan base, thereby permitting movement of the heat-conducting plate toward and away from the heat-dissipating side of the electronic component.

BRIEF DESCRIPTION OF THE DRAWINGS

Other features and advantages of the present invention will become apparent in the following detailed description of the preferred embodiment with reference to the accompanying drawings, of which.

DETAILED DESCRIPTION OF THE PREFERRED EMBODIMENT

Figure 1:
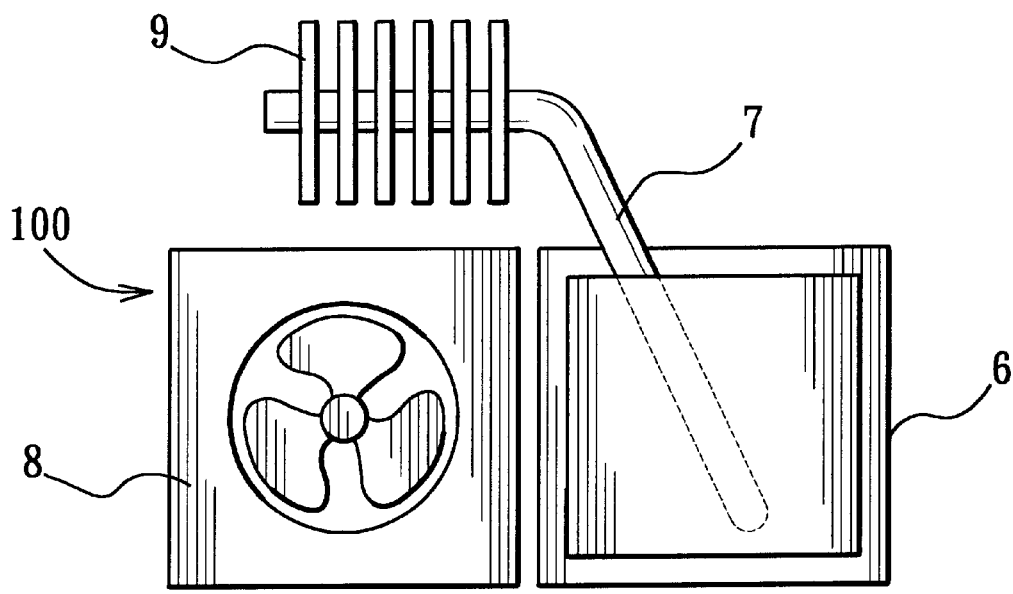
FIG. 1 is a schematic view of a conventional heat-dissipating device.
Figure 2:
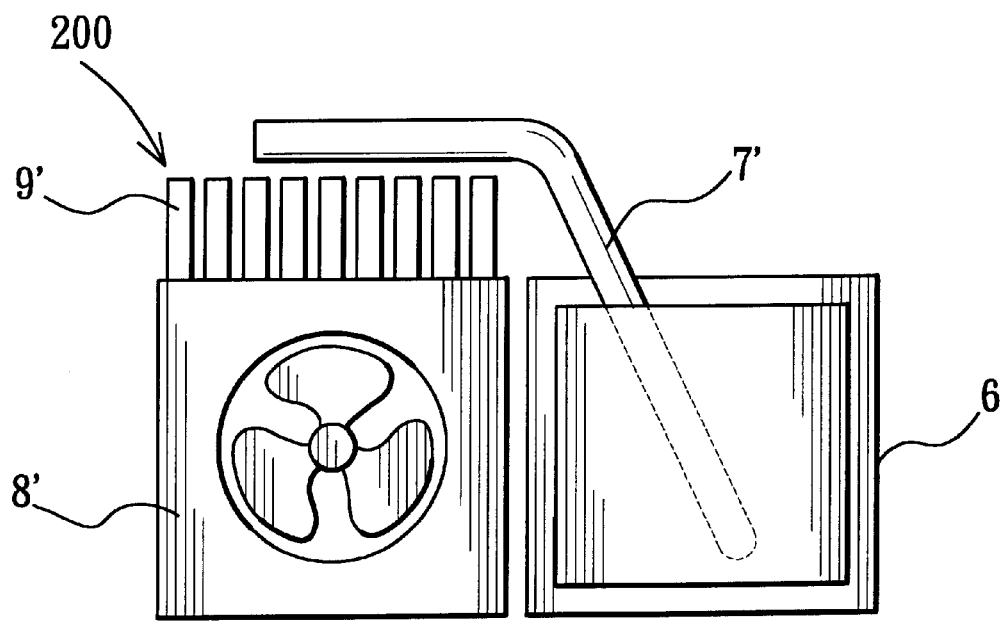
FIG. 2 is a schematic view of another conventional heat-dissipating device.
Figure 3:
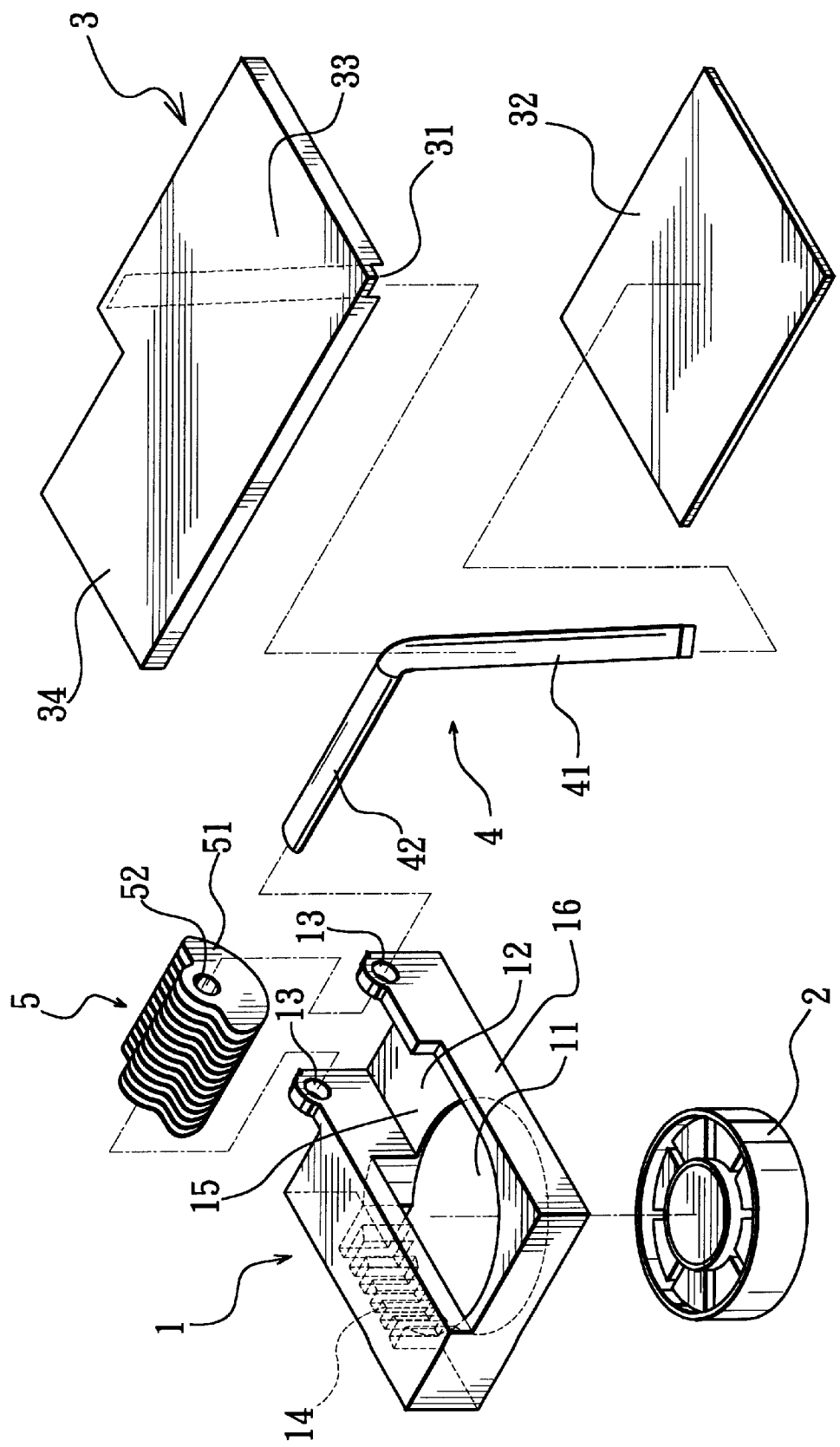
FIG. 3 an exploded perspective view of a preferred embodiment of the heat-dissipating module of the present invention.
Figure 4:
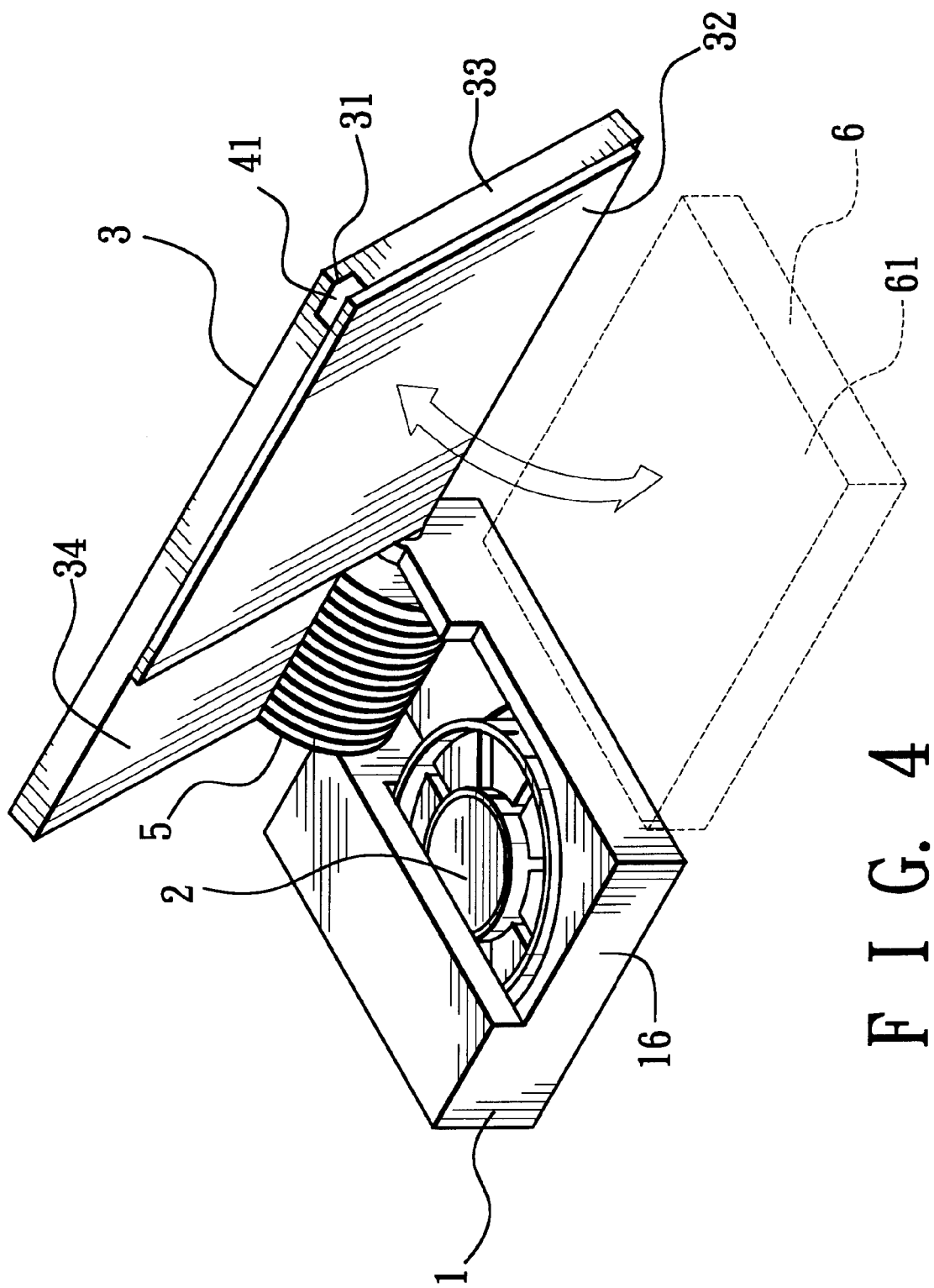
FIGS. 4 and 5 are perspective views of the preferred embodiment in a state of use.

Referring to FIGS. 3 and 4, the preferred embodiment of the heat-dissipating module of the present invention is adapted to be mounted in a housing of an electronic device, such as a notebook computer, adjacent to an electronic component 6, such as a CPU, for dissipating heat generated by the electronic component 6. The heat-dissipating module is shown to include a fan base 1, a heat-dissipating fan 2, a heat-conducting plate 3, and a connecting shaft 4. Preferably, the aforementioned components are made of a heat-conducting metal, such as aluminum.

The fan base 1 includes a base plate portion 15 and a generally U-shaped surrounding wall portion 16 which extends upwardly from the base plate portion 15 and which cooperates with the base plate portion 15 to confine a fan mounting cavity 11 and an air channel 12. The heat-dissipating fan 2 is mounted in the fan mounting cavity 11. The air channel 12 is disposed adjacent to and is communicated fluidly with the fan mounting cavity 11. The surrounding wall portion 16 has a rear part that defines the air channel 12 and that is formed with a pair of pivot holes 13 disposed on two sides of the air channel 12. The surrounding wall portion 16 further has a front part that defines the fan mounting cavity 11 and that is formed with a plurality of vent holes 14 which are communicated fluidly with the fan mounting cavity 11 and which are generally disposed in a radial direction of the fan mounting cavity 11. The surrounding wall portion 16 has an upper edge that defines an open upper end of the fan mounting cavity 11.

The heat-conducting plate 3 has a component contacting portion 33 that is adapted to contact a heat-dissipating side 61 of the electronic component 6, and a base contacting portion 34 that extends from the component contacting portion 33. The component contacting portion 33 has a component contacting side that is formed with a mounting groove 31 and that has a heat-conductive contact plate 32 mounted thereon.

The connecting shaft 4 has a mounting section 41 received in the mounting groove 31 on the component contacting side of the component contacting portion 33 of the heat-conducting plate 3, and a pivot section 42 that extends from the mounting section 41 and that forms an angle with the mounting section 41. The pivot section 42 extends pivotally through the pivot holes 13 and across the air channel 12 in the fan base 1 for mounting pivotally on the fan base 1, thereby permitting pivoting movement of the heat-conducting plate 3 toward and away from the heat-dissipating side 61 of the electronic component 6. A heat sink 5, which includes a stack of spaced-apart fin plates 51, is disposed in the air channel 12 and is mounted on the pivot section 42 of the connecting shaft 4. The fin plates 51 are formed with aligned holes 52 through which the pivot section 42 of the connecting shaft 4 extends.

Figure 5:
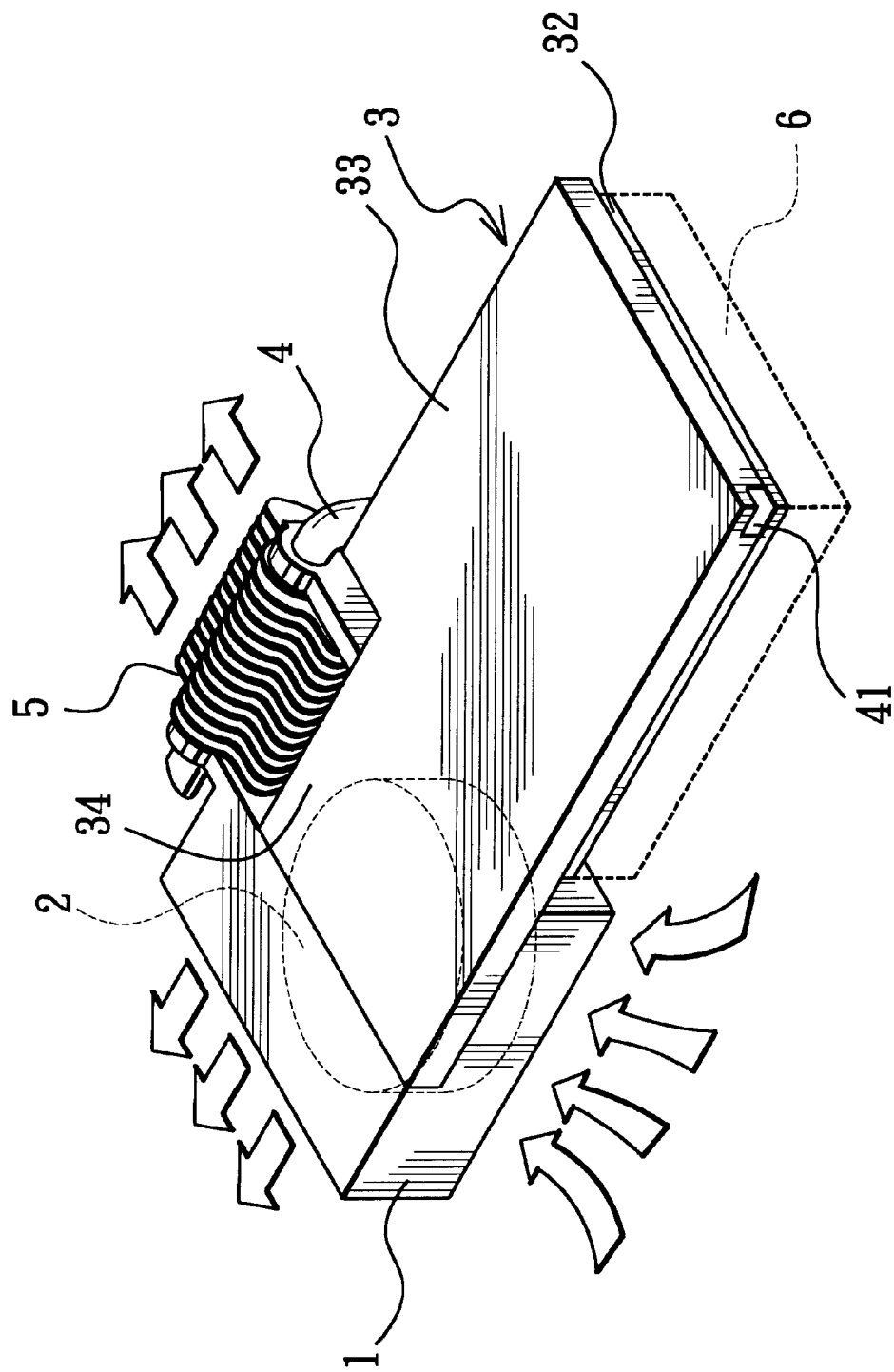

After the heat-dissipating module of the preferred embodiment is mounted in the housing of the electronic appliance, the heat-conducting plate 3 is turnable about an axis of the pivot section 42 of the connecting shaft 4 away from the heat-dissipating side 61 of the electronic component 6 to be disposed in an open position as shown in FIG. 4, where the electronic component 6 is accessible from a top side of the heat-dissipating module to permit detachment, installation and replacement of the electronic component 6. The heat-conducting plate 3 is further turnable about the axis of the pivot section 42 of the connecting shaft 4 toward the heat-dissipating side 61 of the electronic component 6 to be disposed in a closed position, as shown in FIG. 5. At this time, the heat-conductive contact plate 32 on the component contacting side of the component contacting portion 33 of the heat-conducting plate 3 contacts the heat-dissipating side 61 of the electronic component 6, and the base contacting portion 34 of the heat-conducting plate 3 rests on the upper edge of the surrounding wall portion 16 of the fan base 1 to cover the open upper end of the fan mounting cavity 11.

In use, the heat generated by the electronic component 6 is transmitted from the component contacting portion 33 of the heat-conducting plate 3 toward the base contacting portion 34. Cooling air is drawn into the fan mounting cavity 11 from an open bottom end of the fan mounting cavity 11 by the fan 2, and is heated by the base contacting portion 34. The resulting hot air can then be discharged to an exterior of the fan base 1 through the air channel 12 and the vent holes 14, as illustrated in FIG. 5, to prevent overheating of the electronic component 6.

Since the connecting shaft 4, the heat-conducting plate 3 and the fan base 1 are connected to one another, and since the base contacting portion 34 of the heat-conducting plate 3 extends to a top side of the heat-dissipating fan 2, the resulting heat-dissipating effect is relatively good.

In a modified embodiment, the heat-conducting plate 3 may be formed integrally with the connecting shaft 4 to further enhance the heat-dissipating effect. In another modified embodiment, the heat-conducting plate 3 may be formed integrally with the connecting shaft 4 and the heat sink 5. However, under this condition, the surrounding wall portion of the fan base should be modified to permit mounting of the pivot section of the connecting shaft pivotally thereon.

With the use of the heat-dissipating module of the present invention, the electronic component 6 can be readily accessed so as to permit detachment thereof for replacement with a new one by simply turning the heat conducting plate 3 away from the electronic component 6. None of the components of the heat-dissipating module needs to be detached together with the electronic component 6. Moreover, as described hereinbefore, the heat-dissipating module of the present invention provides a relatively good heat-dissipating effect since the heat-dissipating module is not divided into non-connected parts, as taught in prior art.

While the present invention has been described in connection with what is considered the most practical and preferred embodiments, it is understood that this invention is not limited to the disclosed embodiments but is intended to cover various arrangements included within the spirit and scope of the broadest interpretation so as to encompass all such modifications and equivalent arrangements.

I claim:

1. A heat-dissipating module adapted for dissipating heat generated by an electronic component, comprising:

a fan base formed with a fan mounting cavity;

a heat-dissipating fan mounted in said fan mounting cavity;

a heat-conducting plate adapted to contact a heat-dissipating side of the electronic component; and a connecting shaft having a mounting section that is mounted on said heat-conducting plate, and a pivot section that extends from said mounting section and that is mounted pivotally on said fan base, thereby permitting movement of said heat-conducting plate toward and away from the heat-dissipating side of the electronic component.

2. The heat-dissipating module of claim 1, wherein said fan base includes a base plate portion and a generally U-shaped surrounding wall portion that extends from and that cooperates with said base plate portion to confine said fan mounting cavity.

3. The heat-dissipating module of claim 2, wherein said surrounding wall portion further confines an air channel that is disposed adjacent to and that is communicated fluidly with said fan mounting cavity.

4. The heat-dissipating module of claim 3, wherein said surrounding wall portion is formed with a pair of pivot holes disposed on two sides of said air channel, said pivot section of said connecting shaft extending pivotally through said pivot holes and across said air channel.

5. The heat-dissipating module of claim 4, further comprising a heat sink disposed in said air channel and mounted on said pivot section of said connecting shaft.

6. The heat-dissipating module of claim 5, wherein said heat sink includes a stack of spaced-apart fin plates which are formed with aligned holes through which said pivot section of said connecting shaft extends.

7. The heat-dissipating module of claim 2, wherein said surrounding wall portion is further formed with a plurality of vent holes that are communicated fluidly with said fan mounting cavity.

8. The heat-dissipating module of claim 7, wherein said vent holes are generally disposed in a radial direction of said fan mounting cavity.

9. The heat-dissipating module of claim 2, wherein said heat-conducting plate includes a component contacting portion that is adapted to contact the heat-dissipating side of the electronic component, and a base contacting portion that extends from said component contacting portion and that rests on top of said surrounding wall portion of said fan base when said heat-conducting plate is turned toward the heat-dissipating side of the electronic component.

10. The heat-dissipating module of claim 9, wherein said surrounding wall portion of said fan base has an upper edge that defines an open upper end of said fan mounting cavity, said base contacting portion of said heat-conducting plate resting on said upper edge of said surrounding wall portion and covering said open upper end of said fan mounting cavity when said heat-conducting plate is turned toward the heat-dissipating side of the electronic component.

11. The heat-dissipating module of claim 9, wherein said component contacting portion of said heatconducting plate has a component contacting side that is formed with a mounting groove for receiving said mounting section of said connecting shaft.

12. The heat-dissipating module of claim 11, wherein said heat-conducting plate has a heat-conductive contact plate mounted on said component contacting side thereof.

13. The heat-dissipating module of claim 1, wherein said mounting section forms an angle with said pivot section of said connecting shaft.

* * * * *